(12) United States Patent
Ning

(10) Patent No.: US 7,547,595 B2
(45) Date of Patent: Jun. 16, 2009

(54) INTEGRATION SCHEME METHOD AND STRUCTURE FOR TRANSISTORS USING STRAINED SILICON

(75) Inventor: Xian J. Ning, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 491 days.

(21) Appl. No.: 11/471,035

(22) Filed: Jun. 19, 2006

(65) Prior Publication Data

US 2007/0099369 A1 May 3, 2007

(30) Foreign Application Priority Data

Oct. 31, 2005 (CN) .................... 2005 1 0110068

(51) Int. Cl.
*H01L 21/336* (2006.01)
*H01L 21/8234* (2006.01)
*H01L 21/8238* (2006.01)

(52) U.S. Cl. .................. 438/199; 438/197; 438/223; 438/224; 438/283; 257/E21.561; 257/E21.634; 257/E21.636; 257/E21.64

(58) Field of Classification Search .......... 257/E21.561, 257/E21.634, E21.636, E21.64
See application file for complete search history.

(56) References Cited

U.S. PATENT DOCUMENTS 6,410,377 B1 * 6/2002 Hwang et al. .............. 438/200

| | | | |
|---|---|---|---|
| 2004/0023478 A1 * | 2/2004 | Samavedam et al. | 438/592 |
| 2006/0003513 A1 * | 1/2006 | Helm et al. | 438/199 |
| 2006/0194395 A1 * | 8/2006 | Ning et al. | 438/286 |
| 2007/0196992 A1 * | 8/2007 | Xiang et al. | 438/320 |
| 2008/0157091 A1 * | 7/2008 | Shin et al. | 257/66 |

* cited by examiner

*Primary Examiner*—Walter L Lindsay, Jr.
*Assistant Examiner*—Mohsen Ahmadi
(74) *Attorney, Agent, or Firm*—Townsend and Townsend and Crew LLP

(57) ABSTRACT

A method for forming CMOS integrated circuits. The method forms a blanket layer of silicon dioxide overlying an entirety of the surface region of a first well region and a second well region provided on a semiconductor substrate. The blanket layer of silicon dioxide is overlying the hard mask on the first gate structure and the second gate structure. The blanket layer of silicon dioxide is also overlying a region to be protected. Depending upon the embodiment, the region can be a sidewall spacer structure and portion of an MOS device on a peripheral region of the substrate. Of course, there can be other variations, modifications, and alternatives. The method protects the region to be protected using a masking layer, while the surface region of the first well region and the second well region being exposed. The method selectively removes exposed portions of the blanket layer of silicon dioxide, including the hard mask on the first gate structure and the second gate structure, while exposing a first polysilicon material on the first gate structure and while exposing a second polysilicon material on the second gate structure. The method strips the masking layer. The method also includes forming a silicided layer overlying the first polysilicon material on the first gate structure and the second polysilicon material on the second gate structure, while the region to be protected remains free from the silicided layer.

20 Claims, 9 Drawing Sheets

INTEGRATION SCHEME METHOD AND STRUCTURE FOR TRANSISTORS USING STRAINED SILICON

CROSS-REFERENCES TO RELATED APPLICATIONS

The present application claims priority to Chinese Patent Application No. 200510110068.6 (filed Oct. 31, 2005) commonly assigned, and hereby incorporated by reference for all purposes.

The present application relates to U.S. Ser. No. 11/244,955, commonly assigned, and hereby incorporated by reference for all purposes.

BACKGROUND OF THE INVENTION

The present invention is directed to integrated circuits and their processing for the manufacture of semiconductor devices. More particularly, the invention provides a method and structures for integrating PMOS and NMOS devices using strained silicon structures for advanced CMOS integrated circuit devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of MOS devices itself. Such device has traditionally became smaller and smaller and produced faster switching speeds. Although there have been significant improvements, such device designs still have many limitations. As merely an example, these designs must become smaller and smaller but still provide clear signals for switching, which become more difficult as the device becomes smaller. Additionally, these designs are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for integrating PMOS and NMOS devices using strained silicon structures for advanced CMOS integrated circuit devices. But it would be recognized that the invention has a much broader range of applicability.

As further background information, integrated circuit processes generally involves gate patterning, which is normally using a poly crystalline silicon as a gate conductor. In the process, a polysilicon film is deposited on the substrate, which is a single crystal silicon that has undergone various processes such as implantations, gate oxide formation, among others. The polysilicon is then covered with one or more dielectric materials such as silicon oxide and/or silicon oxynitride. The dielectric film is then photo lithographically patterned and etched to form the gate conductor pattern. The patterned dielectric materials is then used as "hard mask" to transfer the pattern into polysilicon using a plasma etch process. The hard mask is stripped by wet chemicals after polysilicon patterning.

As critical dimension become smaller, silicon germanium (SiGe) source and drains selectively grown using epitaxial films in designated regions of the silicon substrate have been used in PMOS devices in CMOS technologies. Prior to the epitaxial film growth, the method includes a silicon etch applied to the recess the silicon substrate, which is for the silicon germanium material. The hard mask for patterning the polysilicon gate mentioned above will be used for the self-aligned mask for recess etch in the silicon substrate. The hard mask will then have be removed after epitaxial silicon germanium growth in order perform a silicide process on exposed portions of the polysilicon gate. The dielectric hard mask is often difficult to remove and leads to undesirably eroding the polysilicon gate spacer, which has been formed after the polysilicon gate patterning process as well as the shallow trench isolation (STI) process. Doping of the polysilicon gate is often difficult and leads to other limitations. To overcome one or more of these limitations, the present method provides an integration method uses silicon germanium epitaxial films for PMOS devices. The poly hard mask, spacer materials and silicide blocking layer are designed to be compatible with each other and have a minimum number of processing steps and/or reduced number of process steps according to a specific embodiment. Further details of our method and structure can be found throughout the present specification and more particularly below.

In a specific embodiment, the present invention provides a method for forming a semiconductor integrated circuit device, e.g., CMOS integrated circuit device. The method includes providing a semiconductor substrate (e.g., silicon, silicon on insulator, epitaxial silicon) including a first well region (e.g., N-type well) and a second well region (e.g., P-type well). The method includes forming a dielectric layer (e.g., silicon dioxide, silicon nitride, silicon oxynitride) overlying the semiconductor substrate including the first well region and the second well region. The method includes forming a polysilicon gate layer overlying the dielectric layer. In a preferred embodiment, the polysilicon gate layer is overlying a first channel region in the first well region and a second channel region in the second well region in the semiconductor substrate. The method includes forming a hard mask (e.g., silicon dioxide, silicon nitride) overlying the polysilicon gate layer. The method patterns the polysilicon gate layer, including the hard mask layer, to form a first gate structure including first edges in the first well region and a second gate structure including second edges in the second well region. The method forms a liner layer overlying the first gate structure and the second gate structure and overlying first source/drain regions in the first well region and second source/drain regions in the second well region. The method forms a spacer dielectric layer (e.g., silicon dioxide, silicon dioxide/nitride/dioxide, silicon dioxide/nitride) overlying the liner layer. The method patterns the spacer dielectric layer to form first sidewall spacer structures on the first gate structure, including the first edges and to form the second sidewall spacer structures on the second gate structure, including the second edges. The method etches a first source region and a first drain region adjacent to the first gate structure using the hard mask layer and the first sidewall spacers as a protective layer. In a preferred embodiment, the etching method uses plasma etching and/or other suitable techniques. The method then deposits a silicon germanium fill material into the first source region and the first drain region to fill the etched first source region and the etched first drain region while causing the first channel region between the first source region and the first drain region to be strained in compressive mode from at least the silicon germanium material formed in the first source region and the first drain region.

In a preferred embodiment, the method forms a blanket layer of silicon dioxide overlying an entirety of the surface region of the first well region and the second well region. The blanket layer of silicon dioxide is overlying the hard mask on the first gate structure and the second gate structure. The blanket layer of silicon dioxide is also overlying a region to be protected. Depending upon the embodiment, the region can be a sidewall spacer structure and portion of an MOS device on a peripheral region of the substrate. Of course, there can be other variations, modifications, and alternatives. The method protects the region to be protected using a masking layer, while the surface region of the first well region and the second well region being exposed. The method selectively removes exposed portions of the blanket layer of silicon dioxide, including the hard mask on the first gate structure and the second gate structure, while exposing a first polysilicon material on the first gate structure and while exposing a second polysilicon material on the second gate structure. The method strips the masking layer. The method also includes forming a silicided layer overlying the first polysilicon material on the first gate structure and the second polysilicon material on the second gate structure, while the region to be protected remains free from the silicided layer.

Depending upon the embodiment, one or more of these features may exist.

1. In a specific embodiment, the present method and structure uses a nitride rich silicon oxynitride layer (SiON) as a polysilicon hard mask. In a preferred embodiment, the hard mask is characterized by a high selectivity to silicon dioxide and/or silicon rich oxide in reference to single crystal silicon and/or polysilicon using a wet etchant such as phosphoric acid.

2. The present method and structure also uses a silicon oxide and/or silicon rich oxide (or oxynitride) layer as a spacer protection layer during polysilicon hard mask removal as well as processing of the salicide block layer according to a specific embodiment.

3. In a specific embodiment, the present method uses a phosphoric acid based chemical to remove a polysilicon hard mask layer, which is often difficult to remove with conventional techniques.

Depending upon the embodiment, one or more of these features can exist. Of course, there can be other variations, modifications, and alternatives.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 90 nanometers and less and/or 65 nanometers and less. Additionally, the invention provides for increased mobility of holes using a strained silicon structure for CMOS devices. In a preferred embodiment, the present invention provides an improved integration scheme for CMOS devices according to an embodiment of the present invention. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and structures for integrating PMOS and NMOS devices using strained silicon structures for advanced CMOS integrated circuit devices. But it would be recognized that the invention has a much broader range of applicability.

Figure 1:
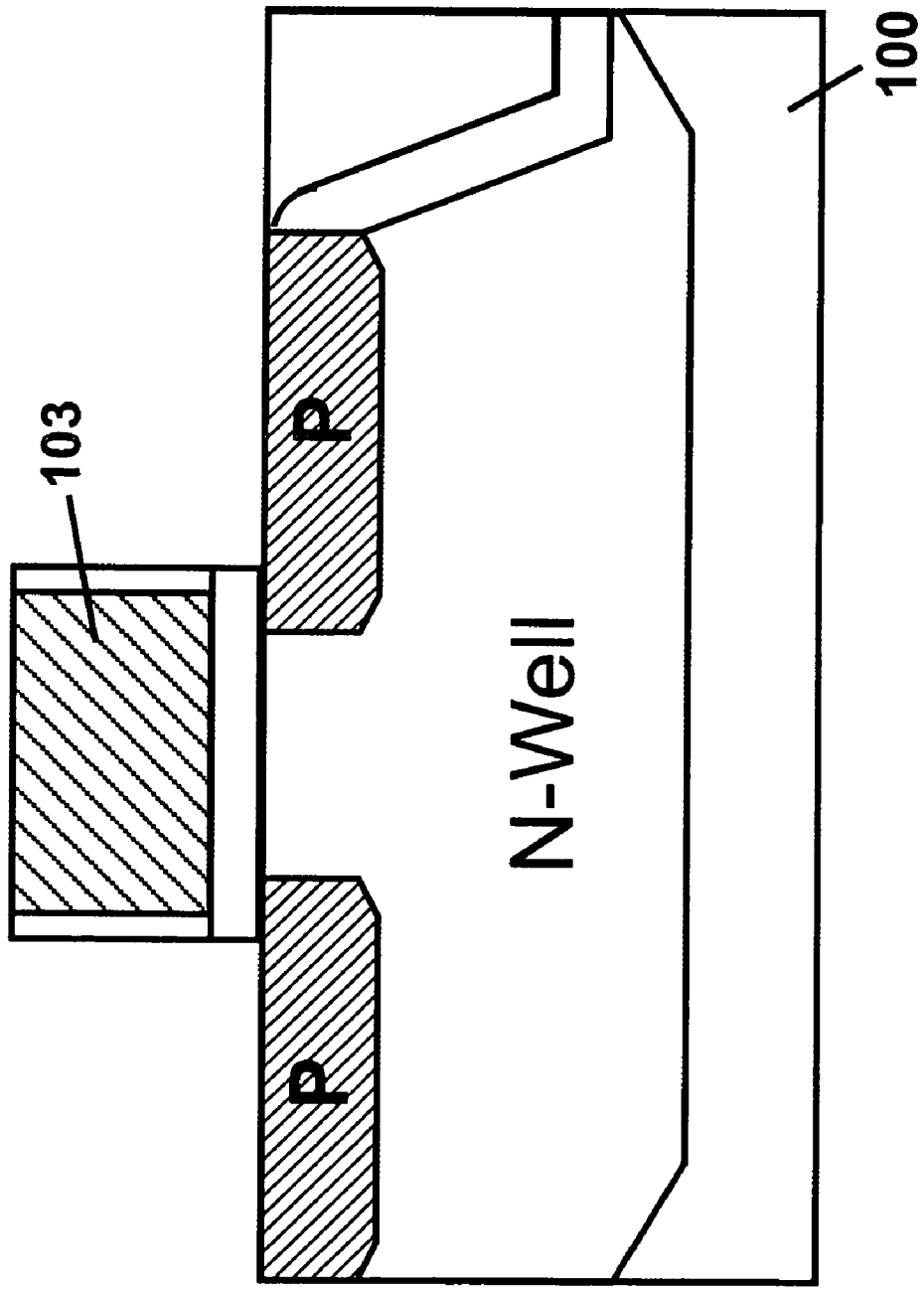
FIGS. 1 through 3 are simplified cross-sectional view diagrams illustrating a conventional method for fabricating a strained silicon MOS device.
Figure 2:
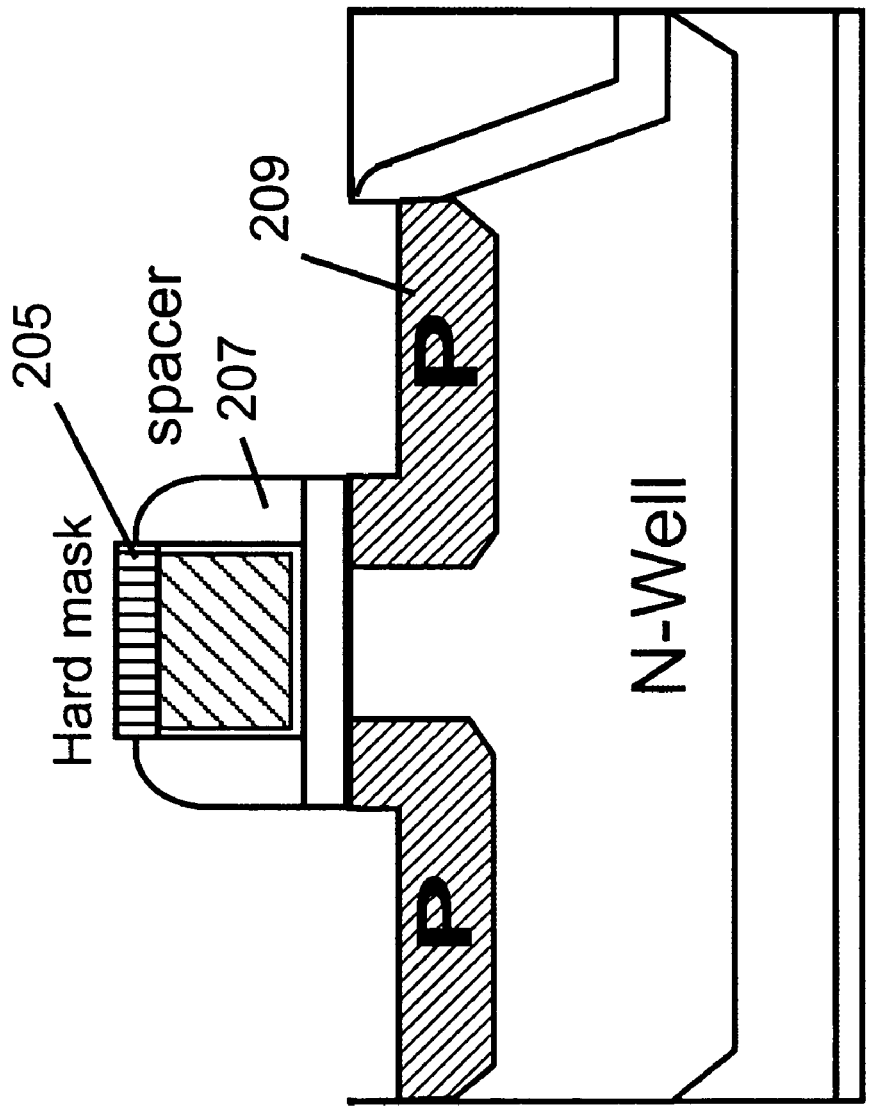
Figure 3:
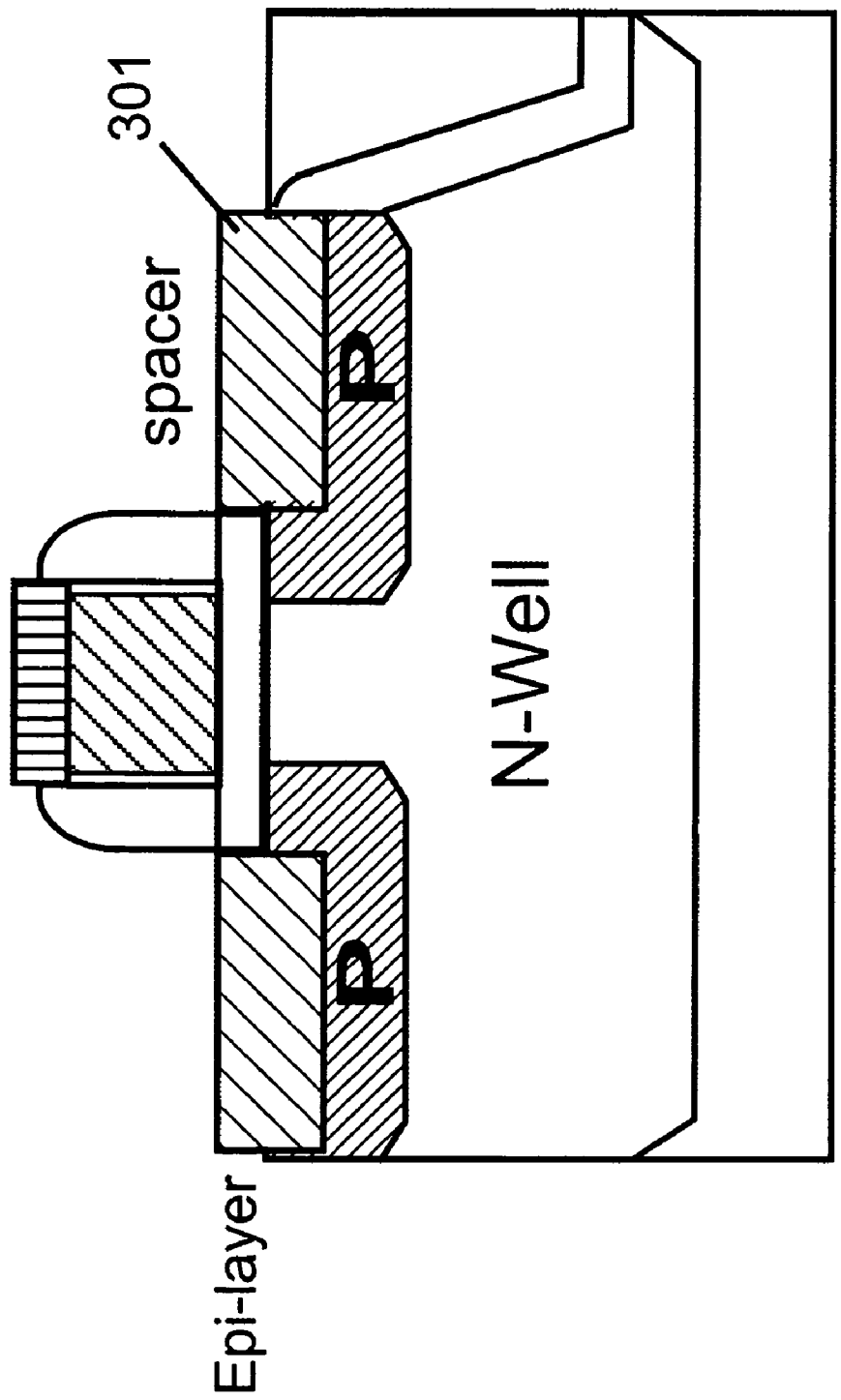
Figure 4:
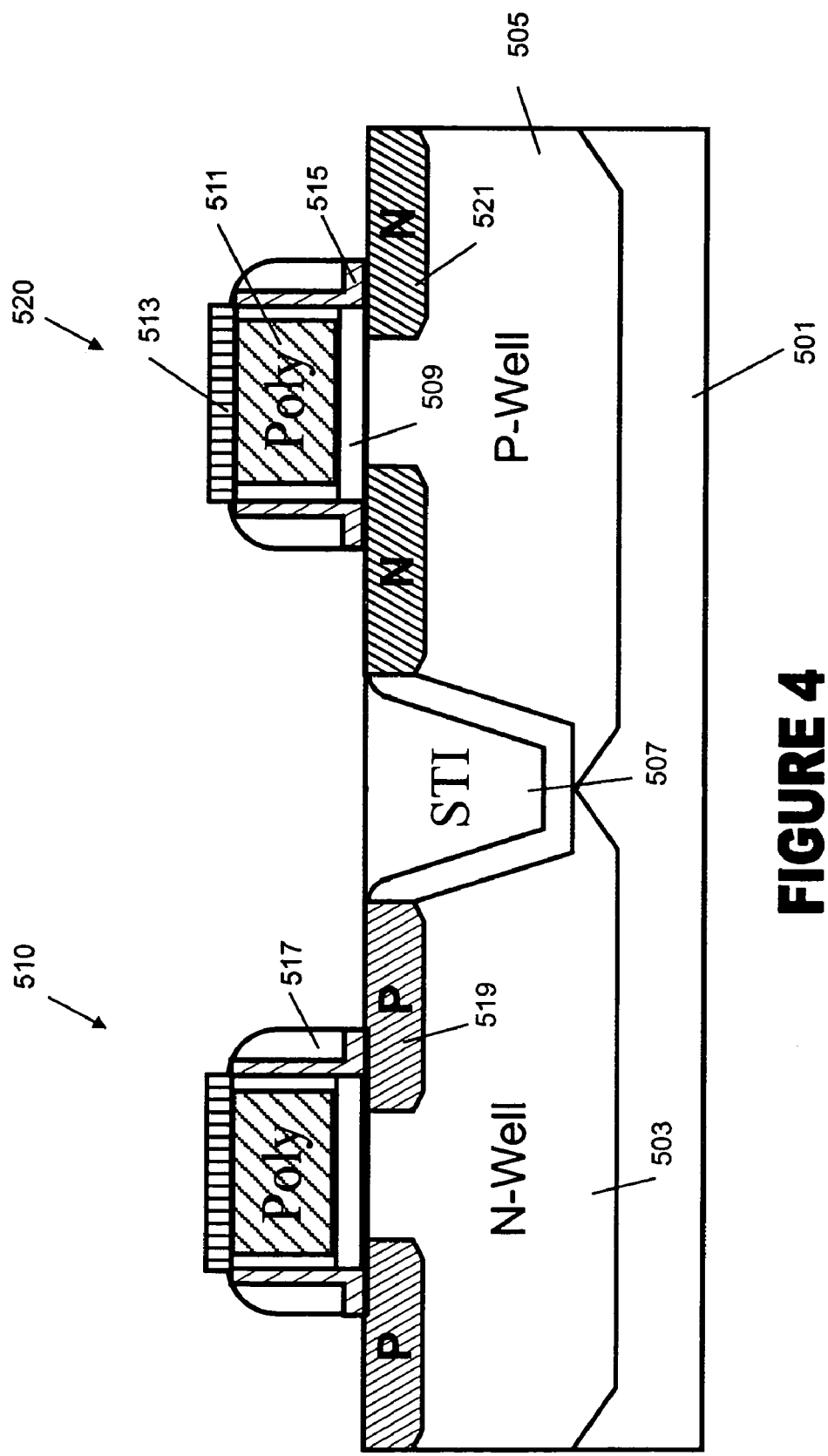
FIGS. 4 through 9 are simplified cross-sectional view diagrams illustrating a method for fabricating a strained silicon CMOS device according to an embodiment of the present invention.

FIGS. 1 through 3 are simplified cross-sectional view diagram of conventional methods for fabricating a strained silicon MOS device. Referring to FIGS. 1 through 3, a conventional process sequence has been reproduced below.

1. Provide a silicon substrate (100);
2. Form gate layer (103);
3. Form dielectric hard mask (205);
4. Pattern dielectric mask;
5. Pattern gate layer to form polysilicon gates;
6. Deposit spacer layer and etch back to form spacer structures 207;
7. Etch source/drain recessed regions 209 in silicon;
8. Form epitaxial silicon/germanium 301 in recessed regions;
9. Remove hard mask; and
10. Perform other steps as desired.

As noted above, the NMOS device is often made using the above process steps. As the device becomes more complex and line rules become smaller, it is more difficult to manufacture the NMOS device for CMOS technologies. These and other limitations may be overcome by the present method and structures, which will be described in more detail below.

A method for fabricating an integrated circuit device according to an embodiment of the present invention may be outlined as follows:

1. Provide a semiconductor substrate (e.g., silicon, silicon on insulator, epitaxial silicon);
2. Form a first well region (e.g., N-type well) and a second well region, e.g., P-type well in the semiconductor substrate;
3. Form a dielectric layer (e.g., silicon dioxide, silicon nitride, silicon oxynitride) overlying the semiconductor substrate including the first well region and the second well region;
4. Form a polysilicon gate layer (e.g., doped polysilicon, insitu-doped polysilicon, amorphous silicon, which is crystallized) overlying the dielectric layer;
5. Form a hard mask (e.g., dielectric layer) overlying the polysilicon gate layer;
6. Pattern the polysilicon gate layer, including the hard mask layer, to form a first gate structure including first edges in the first well region and a second gate structure including second edges in the second well region;
7. Form a liner layer (e.g., TEOS) overlying the first gate structure and the second gate structure and overlying first source/drain regions in the first well region and second source/drain regions in the second well region;
8. Form a spacer dielectric layer overlying the liner layer;
9. Pattern the spacer dielectric layer to form first sidewall spacer structures on the first gate structure, including the first edges and to form the second sidewall spacer structures on the second gate structure, including the second edges;
10. Protect the second well region including the second gate structure using a masking layer;
11. Etch a first source region and a first drain region adjacent to the first gate structure using the hard mask layer and the first sidewall spacers as a protective layer;
12. Remove the masking layer from the second well region;
13. Deposit a silicon germanium fill material into the first source region and the first drain region to fill the etched first source region and the etched first drain region;
14. Cause the first channel region between the first source region and the first drain region to be strained in compressive mode from at least the silicon germanium material formed in the first source region and the first drain region;
15. Form a blanket layer of silicon rich oxide and/or nitride layer overlying an entirety of the surfaces on the first well region and the second well region, and overlying the hard mask layer on the first gate structure and the second gate structure, and overlying at least one other portion of the surface region, which will be protected;
16. Form a second masking layer overlying the portion of the surface region to be protected;
17. Selectively remove exposed portions of the blanket layer while removing the hard mask layer from the first gate structure and the second gate structure; and
18. Strip the second masking layer, while the portion of the blanket layer remains overlying the surface region to be protected;
19. Perform a silicide process overlying the surface region, while the protected surface region remains free from silicide;
20. Perform other steps, as desired.

The above sequence of steps provides a method according to an embodiment of the present invention. As shown, the method uses a combination of steps including a way of forming an integrated circuit device such as an MOS device for a CMOS integrated circuit. As shown, the method includes using a silicon rich oxide or silicon rich nitride or silicon oxide layer to facilitate the manufacture of both NMOS and PMOS devices in the CMOS integrated circuit device according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

FIGS. 4 through 9 are simplified cross-sectional view diagrams illustrating a method for fabricating a strained silicon CMOS device according to an embodiment of the present invention. These diagrams are merely examples, which should not unduly limit the scope of the claims herein. One of ordinary skill in the art would recognize many variations, alternatives, and modifications. As shown, the present method illustrates a semiconductor integrated circuit device, e.g., CMOS, including PMOS 510 and NMOS 520 device regions. The method includes providing a semiconductor substrate 501, e.g., silicon, silicon on insulator, epitaxial silicon. The method includes forming a first well region 503 (e.g., N-type well) and a second well region 505, e.g., P-type well. Field isolation oxide regions, including shallow trench isolation oxide 507, is provided between active regions on the substrate. Of course, there can be other variations, modifications, and alternatives.

In a specific embodiment, the method includes forming a dielectric layer 509 (e.g., silicon dioxide, silicon nitride, silicon oxynitride) overlying the semiconductor substrate including the first well region and the second well region. The method forms a polysilicon gate layer 511 overlying the dielectric layer. In a preferred embodiment, the polysilicon gate layer is overlying a first channel region in the first well region and a second channel region in the second well region in the semiconductor substrate. The polysilicon can be made using a suitable technique including doped polysilicon, insitu-doped polysilicon, and/or amorphous silicon, which is crystallized. Of course, there can be other variations, modifications, and alternatives.

In a specific embodiment, the method forms a hard mask 513 overlying the polysilicon gate layer. The hard mask is often made of a suitable material such as silicon dioxide, silicon nitride, combinations of these, and others. The method patterns the polysilicon gate layer, including the hard mask layer, to form a first gate structure including first edges in the first well region and a second gate structure including second edges in the second well region. As shown, the first gate structure corresponds to the PMOS device region 510 and the second gate structure corresponds to the NMOS device region 520. The PMOS device region also includes lightly doped regions 519, which are often provided by implanting and/or other suitable techniques. The NMOS device region also includes lightly doped regions 521, which are often provided by implanting and/or other suitable techniques.

In a preferred embodiment, the method forms a liner layer 515 overlying the first gate structure and the second gate structure and overlying first source/drain regions in the first well region and second source/drain regions in the second well region. In a preferred embodiment, the liner layer comprises a TEOS material and/or other suitable materials, depending upon the embodiment. In a preferred embodiment, the TEOS layer has a thickness of about 100 Angstroms or greater or 150 Angstroms or greater to be a suitable liner. The TEOS can be deposited using suitable techniques such as chemical vapor deposition, atmospheric chemical vapor deposition, and the like. Of course, the particular thickness will depending upon the specific embodiment, among other factors. In a preferred embodiment, the liner layer encloses an entirety of the surface region of the NMOS and PMOS devices regions, including source/drain regions, gate structures, isolation structures, and other exposed surface regions. Of course, there can be other variations, modifications, and alternatives.

In a specific embodiment, the method forms a spacer dielectric layer 517 overlying the liner layer. The method includes patterning the spacer dielectric layer to form first sidewall spacer structures 603 on the first gate structure, including the first edges and to form the second sidewall spacer structures 605 on the second gate structure, including the second edges according to a specific embodiment. The dielectric layer can be an oxide, a nitride, a silicon oxide/silicon nitride/silicon oxide combination, a silicon oxide/silicon nitride combination, or other suitable materials of sufficient thickness. The dielectric layer is also substantially pinhole free according to preferred embodiments. The dielectric layer is preferably less than 300 Angstroms in preferred embodiments. Of course, there can be other variations, modifications, and alternatives.

Figure 5:
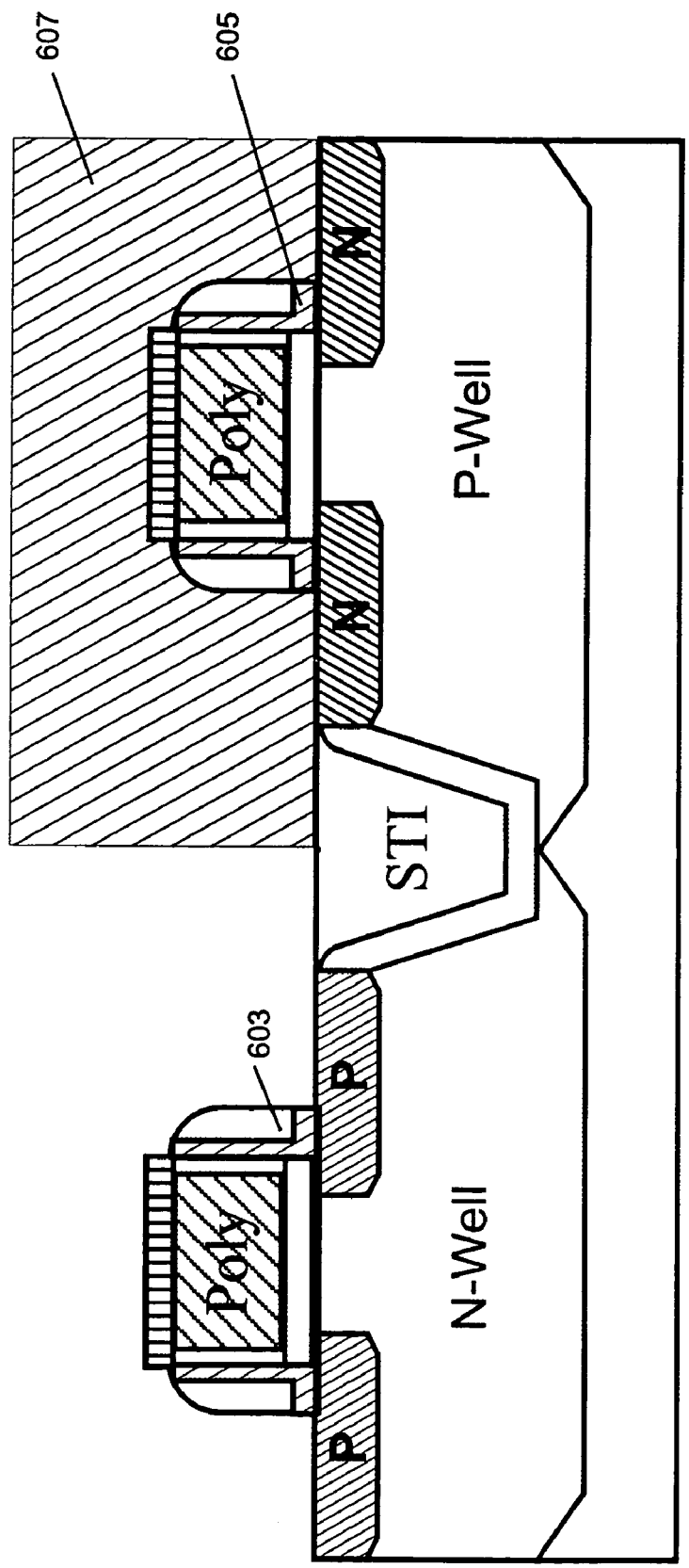

Referring to FIG. 5, the method protects the second well region including the second gate structure using a masking layer 607 overlying the second well region. As shown, the masking layer can be any suitable photolithographic material, such as photo resist and/or other like materials according to a specific embodiment. As shown, the masking material protects the NMOS device region including a portion of the shallow trench isolation, which separates the NMOS region from the PMOS region according to a specific embodiment.

Now, the method etches a first source region and a first drain region adjacent to the first gate structure using the hard mask layer and the first sidewall spacers as a protective layer. Etching occurs in the first source/drain regions, which are substantially silicon based, while other portions of dielectric material act as masking materials according to a specific embodiment. Etching occurs using a plasma etch process to form the recessed regions. Next, the method strips the masking layer overlying the second well region and exposes the second transistor structures in the second well region.

Figure 6:
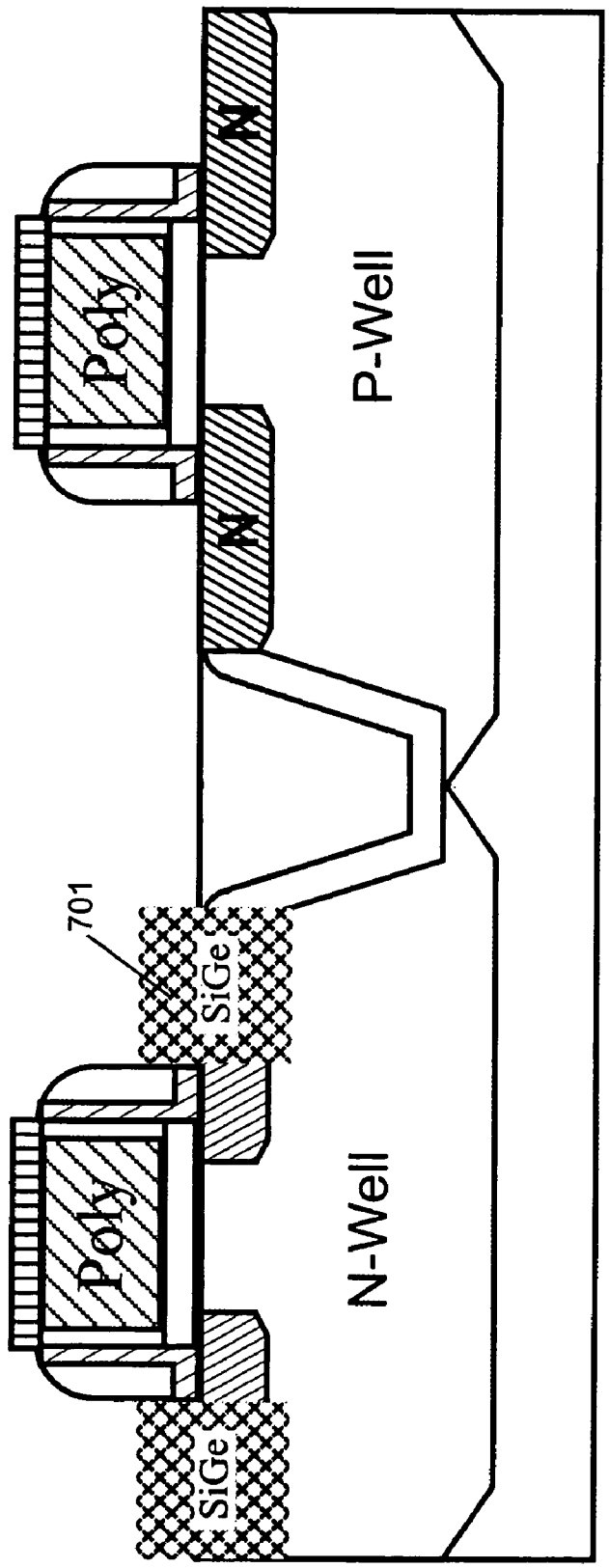

Referring to FIG. 6, the method selectively deposits a silicon germanium fill material 701 into the first source region and the first drain region to fill the etched first source region and the etched first drain region according to a specific embodiment. In a preferred embodiment, the deposition of silicon germanium fill material occurs while portions of the second well region remain free from silicon germanium. In a preferred embodiment, the silicon germanium fill material causes the first channel region between the first source region and the first drain region to be strained in compressive mode from at least the silicon germanium material formed in the first source region and the first drain region. Of course, there can be other variations, modifications, and alternatives.

In a preferred embodiment, the silicon germanium fill material is single crystalline and deposited using an epitaxial reactor. The ratio of silicon/germanium is 10% to 20% according to a specific embodiment. In a specific embodiment, the germanium is characterized by a concentration ranging from about 5 to about 45%, but can be others. The etched source region and the etched drain region are each coupled to the gate structure. As shown, the device has a strained channel region between the filled source region and the filled drain region from at least the silicon germanium material formed in the etched source region and the etched drain region. The device also has lightly doped drain regions or implant regions, which are formed before growing the silicon/germanium material in the recessed regions. Of course, there can be other variations, modifications, and alternatives.

Figure 7:
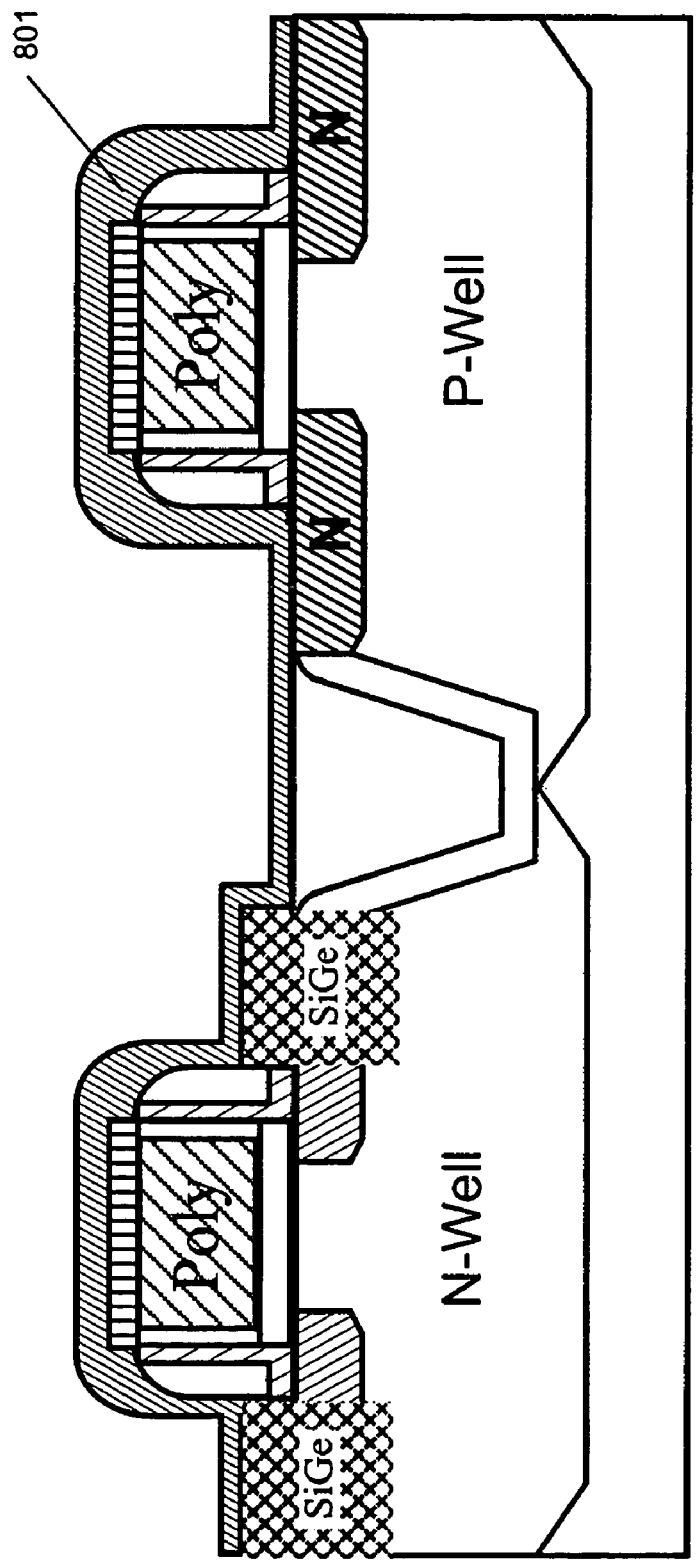

Referring to FIG. 7, the method forms a blanket layer 801 of silicon rich oxide and/or nitride layer overlying an entirety of the surfaces on the first well region and the second well region according to a specific embodiment. As shown, the method also forms the blanket layer overlying the hard mask layer on the first gate structure and the second gate structure, and also overlying at least one other portion of the surface region, which will be protected. In a preferred embodiment, the silicon oxide and/or silicon rich oxide deposition is provided by plasma enhanced chemical vapor deposition (PECVD), for example, with a thickness ranging from about 100 Angstroms to about 500 Angstroms. Of course, there can be other variations, modifications, and alternatives.

Figure 8:
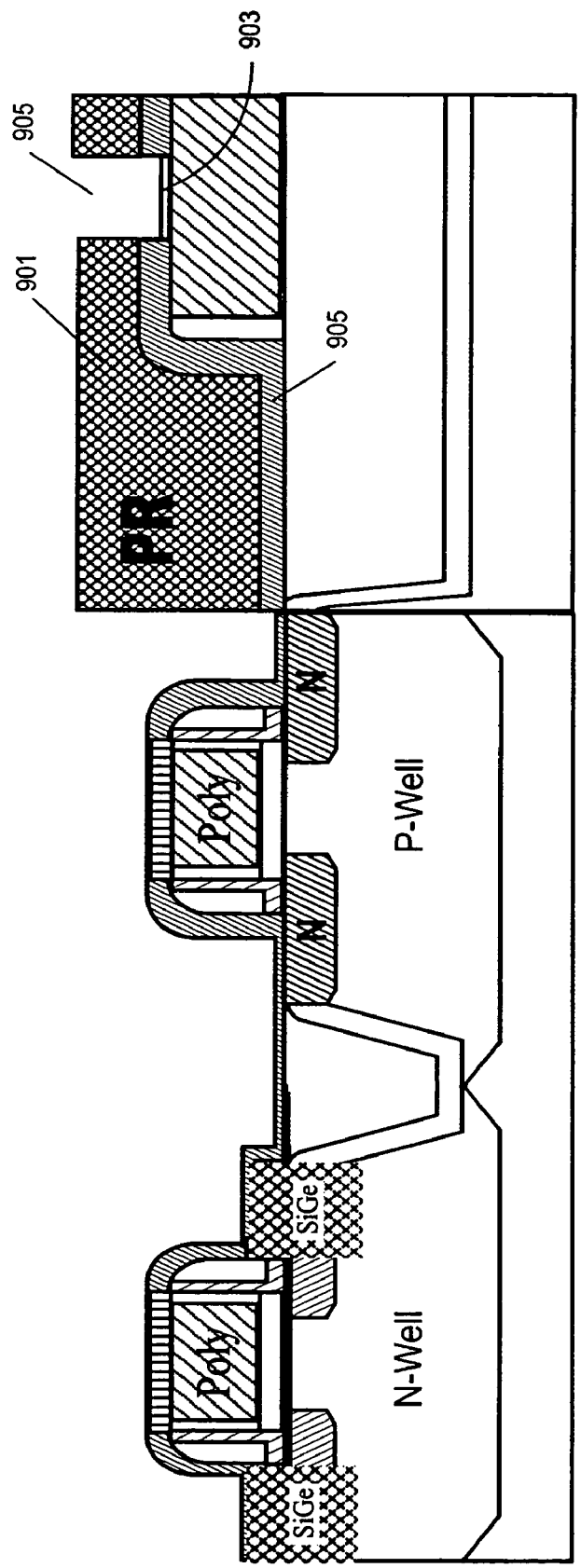

Referring to FIG. 8, the method forms a second masking layer 901 overlying the portion of the surface region to be protected. The second masking layer is provided on the portion of the surface region that will be protected. That is, the blanket layer is protected 905 underlying the masking layer, while other portions 905 are exposed. As shown, contact region 903 is exposed and will be selectively removed. Of course, there can be other variations, modifications, and alternatives.

Figure 9:
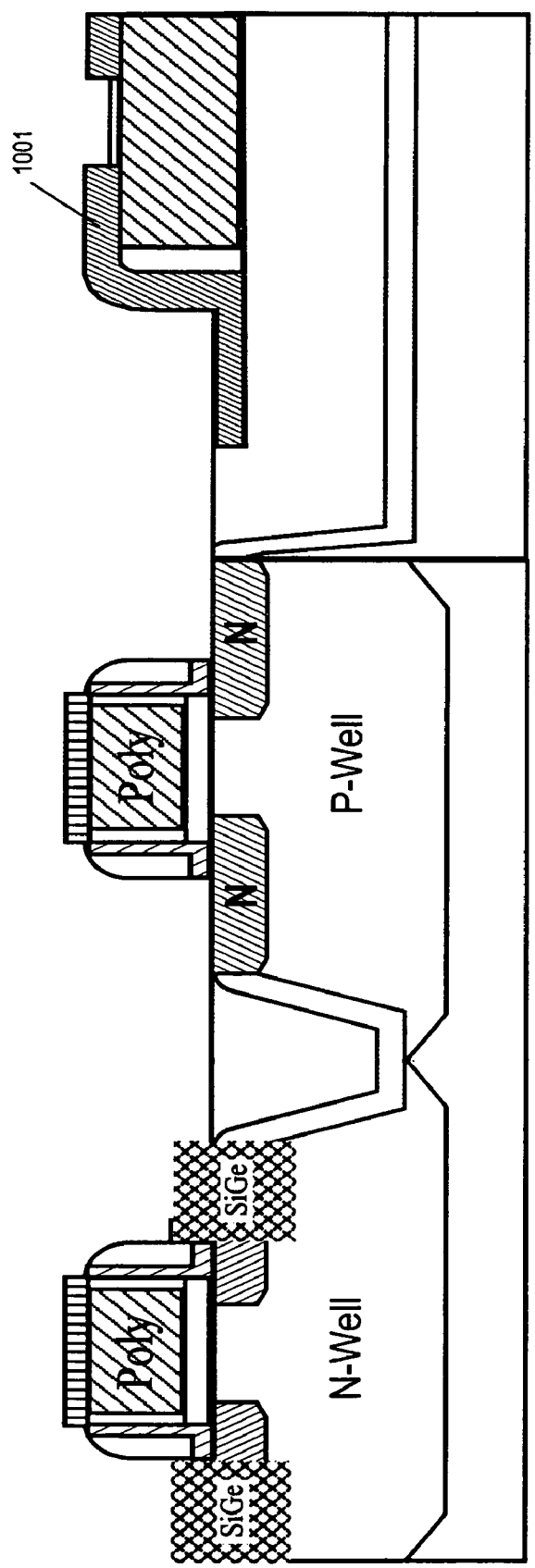

In a specific embodiment, the method selectively removes exposed portions of the blanket layer while removing the hard mask layer from the first gate structure and the second gate structure, as illustrated by the simplified diagram of FIG. 9. As shown, the method also strips the second masking layer, while the portion of the blanket layer remains 1001 overlying the surface region to be protected. As shown, concurrent with the blanket layer, the method strips the hard mask material, which can be selectively removed from the polysilicon gate structures. Depending upon the embodiment, a silicided material (e.g., titanium, tungsten, cobalt, nickel, platinum, and others) can be provided overlying the polysilicon gate structure, as well as other active portions, e.g., source/drain regions, of the PMOS and NMOS device structures.

In a specific embodiment, the method includes a photolithography and etching process that forms one or more regions that do not include silicide formation blocked by a dielectric layer, while removing the bulk part of the film at other regions. The etching process is preferably anisotropic reactive ion etching (RIE) that remove more material on a horizontal surface than on vertical surface regions. As a result, the exposed spacer is covered by a thin oxide layer. Of course, there can be other variations, modifications, and alternatives.

In a specific embodiment, the photoresist is then stripped by ashing, for example. In a preferred embodiment, the substrate is then dipped in a phosphoric acid solution, which selectively removes the silicon rich nitride or silicon oxide or silicon rich oxide and also strips the polysilicon hard mask. In a preferred embodiment, the substrate is further cleaned by a diluted hydrofluoric acid, commonly termed HF, to remove any remaining oxide on the surface regions after removal of the hard mask layer. The method deposits metals including titanium, cobalt, nickel, platinum, and tungsten, for example, using a silicidation process. Other metals can also be used. As has been illustrated, the present method includes a combination of a spacer protection layer that prevents nitride spacer erosion during the gate polysilicon hardmask removal with salicide block into a single process according to a specific embodiment. Hence, the present method can reduce certain steps such as oxide deposition, etch back wet clean, and others associated with both of these processes. Of course, there can be other variations, modifications, and alternatives.

In a specific embodiment, a $SiN_x$ film with high tensile stress is then deposited on the structures by plasma enhanced chemical vapor deposition (PECVD), for example, or other suitable technique. The silicon nitride film thickness ranges from about 200 Angstroms to 1200 Angstroms and is provided overlying the NMOS devices to cause strain in a tensile mode in the NMOS channel region.

In a specific embodiment, the method also includes forming an interlayer dielectric material overlying the entirety of the PMOS and NMOS device structures. In a preferred embodiment, the interlayer dielectric, such as boro-phosphate-silicate-glass (BPSG), boro-silicate glass (BSG), phosphosilicate glass (PSG) or high density plasma (HDP) film is then deposited followed by PECVD oxide layer. Depending upon the specific embodiment, the interlayer dielectric can be a single material, a combination of layers, and the like. The method also includes contact pattern and formation performed to complete the PMOS and NMOS integration on strained silicon. Of course, there can be other variations, modifications, and alternatives.

Although the above has been described in terms of an MOS device, there can be other variations, modifications, and alternatives. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a semiconductor integrated circuit device comprising:
   providing a semiconductor substrate including a first well region and a second well region;
   forming a dielectric layer overlying the semiconductor substrate including the first well region and the second well region;
   forming a polysilicon gate layer overlying the dielectric layer, the polysilicon gate layer being overlying a first channel region in the first well region and a second channel region in the second well region in the semiconductor substrate;
   forming a hard mask overlying the polysilicon gate layer;
   patterning the polysilicon gate layer, including the hard mask layer, to form a first gate structure including first edges in the first well region and a second gate structure including second edges in the second well region;
   forming a liner layer overlying the first gate structure and the second gate structure and overlying first source/drain regions in the first well region and second source/drain regions in the second well region;
   forming a spacer dielectric layer overlying the liner layer;
   patterning the spacer dielectric layer to form first sidewall spacer structures on the first gate structure, including the first edges and to form the second sidewall spacer structures on the second gate structure, including the second edges;
   etching a first source region and a first drain region adjacent to the first gate structure using the hard mask layer and the first sidewall spacers as a protective layer;
   depositing a silicon germanium fill material into the etched first source region and the first drain region to fill the etched first source region and the etched first drain region while causing the first channel region between the first source region and the first drain region to be strained in compressive mode from at least the silicon germanium material formed in the first source region and the first drain region;
   forming a blanket layer of silicon dioxide overlying an entirety of the surface region of the first well region and the second well region, the blanket layer of silicon dioxide overlying the hard mask on the first gate structure and the second gate structure, the blanket layer of silicon dioxide overlying a region to be protected;
   protecting the region to be protected using a masking layer, while the surface region of the first well region and the second well region being exposed;
   selectively removing exposed portions of the blanket layer of silicon dioxide, including the hard mask on the first gate structure and the second gate structure, while exposing a first polysilicon material on the first gate structure and exposing a second polysilicon material on the second gate structure;
   stripping the masking layer; and
   forming a silicided layer overlying the first polysilicon material on the first gate structure and the second polysilicon material on the second gate structure, while the region to be protected remains free from the silicided layer.

2. The method of claim 1 wherein the dielectric layer is less than 300 Angstroms.

3. The method of claim 1 wherein the silicided layer comprises a material selected from titanium, cobalt, nickel, platinum, or tungsten.

4. The method of claim 1 wherein the semiconductor substrate is essential silicon material.

5. The method of claim 1 wherein the silicon germanium material is single crystalline.

6. The method of claim 1 wherein the silicon germanium has a ratio of silicon/germanium of 10% to 20%.

7. The method of claim 1 wherein the selectively removing comprises a wet etch including a hydrogen fluoride species.

8. The method of claim 1 wherein the hard mask is a thickness of about 200 to about 400 Angstroms.

9. The method of claim 1 wherein the depositing is provided using an epitaxial reactor.

10. The method of claim 1 wherein the compressive mode increases a mobility of holes in the first channel region.

11. The method of claim 1 wherein silicon dioxide is a silicon rich oxide or silicon rich silicon oxynitride.

12. The method of claim 1 wherein the spacer dielectric layer comprises an oxide bearing material.

13. The method of claim 1 wherein the spacer dielectric layer comprises an oxide on nitride on oxide material.

14. The method of claim 1 wherein the spacer dielectric layer comprises an oxide on nitride material.

15. The method of claim 1 wherein the blanket layer of silicon oxide has a thickness of about 100 Angstroms to about 500 Angstroms.

16. A method for forming a semiconductor integrated circuit device comprising:
   providing a semiconductor substrate including a first well region and a second well region;
   forming a dielectric layer overlying the semiconductor substrate including the first well region and the second well region;
   forming a polysilicon gate layer overlying the dielectric layer, the polysilicon gate layer being overlying a first channel region in the first well region and a second channel region in the second well region in the semiconductor substrate;
   forming a hard mask overlying the polysilicon gate layer;

patterning the polysilicon gate layer, including the hard mask layer, to form a first gate structure including first edges in the first well region and a second gate structure including second edges in the second well region;

forming a liner layer overlying the first gate structure and the second gate structure and overlying first source/drain regions in the first well region and second source/drain regions in the second well region;

forming a spacer dielectric layer overlying the liner layer;

patterning the spacer dielectric layer to form first sidewall spacer structures on the first gate structure, including the first edges and to form the second sidewall spacer structures on the second gate structure, including the second edges;

protecting the second well region including the second gate structure using a first masking layer overlying the second well region;

etching a first source region and a first drain region adjacent to the first gate structure using the hard mask layer and the first sidewall spacers as a protective layer;

stripping the first masking layer overlying the second well region while exposing a portion of the liner layer overlying the second well region;

depositing a silicon germanium fill material into the first source region and the first drain region to fill the etched first source region and the etched first drain region while causing the first channel region between the first source region and the first drain region to be strained in compressive mode from at least the silicon germanium material formed in the first source region and the first drain region;

forming a blanket layer of silicon oxide overlying an entirety of the surface region of the first well region and the second well region, the blanket layer of silicon oxide overlying the hard mask on the first gate structure and the second gate structure and overlying the first side wall spacer structures and the second sidewall spacer structures, the blanket layer of silicon dioxide overlying a region to be protected;

protecting the region to be protected using a second masking layer, while at least the surface region of the first well region and the second well region being exposed;

selectively removing exposed portions of the blanket layer of silicon oxide, including the hard mask on the first gate structure and the second gate structure, while exposing a first polysilicon material on the first gate structure and exposing a second polysilicon material on the second gate structure;

stripping the second masking layer; and forming a silicided layer overlying the first polysilicon material on the first gate structure and the second polysilicon material on the second gate structure, while at least the region to be protected remains free from the silicided layer.

17. The method of claim 16 wherein the blanket layer has a thickness ranging from about 100 Angstroms to about 500 Angstroms.

18. The method of claim 16 wherein the blanket layer is selected from a material consisting of silicon rich oxide or silicon rich oxynitride.

19. The method of claim 16 wherein the first channel region has a length of about 65 nanometers and less.

20. The method of claim 16 wherein the first masking layer comprises a photo masking material.

* * * * *